United States Patent [19]
Uchida

[11] Patent Number: 5,428,236
[45] Date of Patent: Jun. 27, 1995

[54] SEMICONDUCTOR MEMORY DEVICE HAVING TRENCHED CAPICITOR

[75] Inventor: Yukimasa Uchida, Yokohama, Japan

[73] Assignee: Kabushiki Kaisha Toshiba, Kawasaki, Japan

[21] Appl. No.: 857,727

[22] Filed: Mar. 26, 1992

Related U.S. Application Data

[63] Continuation of Ser. No. 626,410, Dec. 14, 1990, abandoned, which is a continuation of Ser. No. 449,347, Dec. 13, 1989, abandoned, which is a continuation of Ser. No. 681,684, Dec. 14, 1984, abandoned.

[30] Foreign Application Priority Data

Dec. 15, 1983 [JP] Japan .............................. 58-236850
Dec. 15, 1983 [JP] Japan .............................. 58-236851
Jan. 20, 1984 [JP] Japan .............................. 59-7958

[51] Int. Cl.$^6$ .......................................... H01L 27/108
[52] U.S. Cl. .................................................. 257/305
[58] Field of Search .................... 357/236; 257/305

[56] References Cited

U.S. PATENT DOCUMENTS

| | | | |
|---|---|---|---|
| 3,893,146 | 7/1975 | Heeren | 357/23.6 |
| 4,125,933 | 11/1978 | Baldwin et al. | 357/23.6 |
| 4,151,610 | 4/1979 | Suzuki et al. | 365/222 |
| 4,353,086 | 10/1982 | Jaccodine et al. | 357/55 |
| 4,432,006 | 2/1984 | Takei | 357/23.6 |
| 4,538,166 | 8/1985 | Nakano | 357/23.6 |

FOREIGN PATENT DOCUMENTS

| | | | |
|---|---|---|---|
| 85988 | 8/1983 | European Pat. Off. | |
| 18764 | 12/1988 | European Pat. Off. | |
| 51-130178 | 11/1976 | Japan | 357/23.6 |
| 53-10986 | 1/1978 | Japan | 357/23.6 |
| 53-76686 | 7/1978 | Japan | 357/51 |
| 55-39688 | 3/1980 | Japan | 357/23.6 |
| 55-55557 | 4/1980 | Japan | 357/23.6 |
| 59-106146 | 6/1984 | Japan | 357/23.6 |

WO81/03241 12/1981 WIPO .

OTHER PUBLICATIONS

Sunami et al., "A Corrugated Capacitor Cell (CCC) for Megabit Dynamic MOS Memories," IEDM Dig. Tech. Papers, pp. 806–808, Dec. 1982.

Mano et al., "Submicron VLSI Memory Circuits," IEEE International Solid–State Circuits Conference, pp. 234–235, Feb. 1983.

Minegishi et al., "A Submicron CMOS Megabit Level Dynamic RAM Technology Using Doped Face Trench Capacitor Cell," IEDM Dig. Tech. Papers, pp. 319–322, Dec. 5–7, 1983.

"Dynamic random-access memory cell employing V-Groove Connection to buried N + layer and optional oxide capacitor", Chang et al.

Kenney, "Reduced Bit Line Capacitance in VMOS Devices," *IBM Tech. Discl. Bull.*, vol. 23, No. 9, 2/81, pp. 4052–4053.

*Primary Examiner*—William D. Larkins
*Attorney, Agent, or Firm*—Finnegan, Henderson, Farabow, Garrett & Dunner

[57] ABSTRACT

Disclosed is a memory having a p-type semiconductor substrate having a high impurity concentration a p-type semiconductor layer is formed on thereof; a groove which is formed so as to extend from a surface of the semiconductor layer to a position inside the semiconductor substrate; an impurity diffused region which is formed on portions of the semiconductor layer and the semiconductor substrate which define the groove; and an electrode which is formed from the groove to level at least above an opening of the groove through capacitor insulation film, the impurity diffused region, capacitor insulation film and electrode constituting trenched capacitor in which the electrode serves first capacitor electrode and the impurity diffused region serves as a second capacitor electrode.

5 Claims, 11 Drawing Sheets

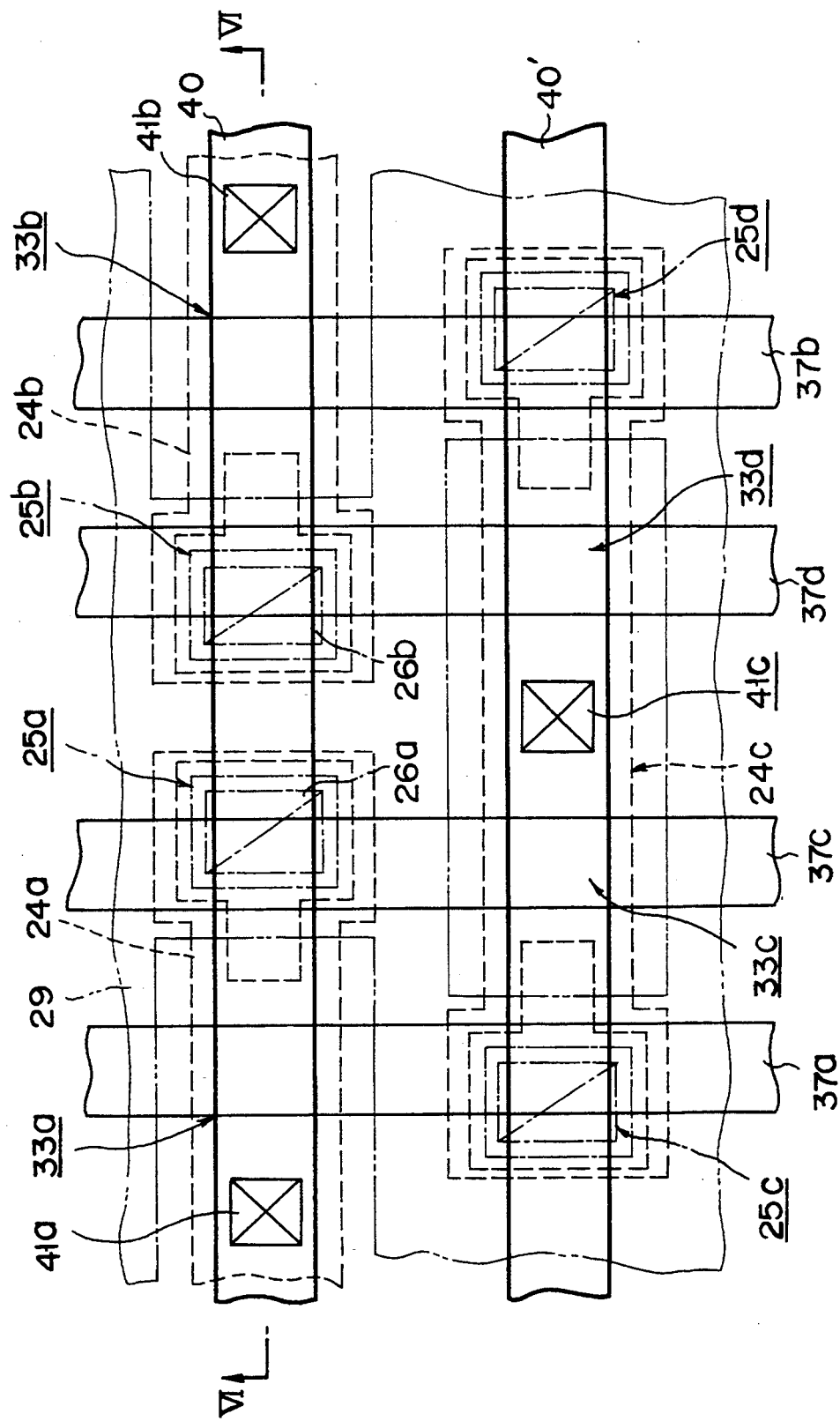

SEMICONDUCTOR MEMORY DEVICE HAVING TRENCHED CAPICITOR

This application is a continuation of application Ser. No. 07/626,410 filed Dec. 14, 1990, now abandoned, which is a Continuation of application Ser. No. 07/449,347, filed Dec. 13, 1989, now abandoned which is a Continuation of application Ser. No. 06/681,684, filed Dec. 14, 1984, now abandoned.

BACKGROUND OF THE INVENTION

The present invention relates to a semiconductor memory device and, more particularly, to a semiconductor memory device in which a structure of a trenched capacitor as a memory portion is improved.

In semiconductor memory devices such as a dynamic memory, a memory capacity thereof has been rapidly increasing in accordance with advances in micropatterning techniques. Along with increases in the capacity of the memory, memory cell area has also been increasing. However, a capacitance of a memory cell must be maintained at a sufficiently large value, i.e., several tens of fF in order to keep the S/N ratio at a proper level for preventing a soft error and for sensing by a sense amplifier.

In order to increase a capacitance per unit area, a thin insulation film of a MOS structure of a memory capacitor can be formed, or a silicon nitride film can be used as an insulation film material. However, since memory capacitors having a MOS structure are formed on a surface of a semiconductor substrate, a capacitance thereof is limited in accordance with micropatterning of the cell area.

Thus, H. Sunami et al. developed and proposed a MOS memory cell having a corrugated capacitor of a structure shown in FIG. 1 which is described in detail in "A Corrugated Capacitor Cell (CCC) for Megabit Dynamic MOS Memories," International Electric Device Meeting Technical Digest, lecture No. 26.9, pp. 806 to 808, December, 1982. In FIG. 1, reference numeral 1 denotes a p-type silicon substrate. A deep groove 2 (e.g., 3 to 5 μm) is formed so as to extend from a surface of the substrate 1 to a certain depth thereof. A capacitor electrode 3 formed of a first polycrystalline silicon layer is insulated by a capacitor insulation film 4 and extends from a bottom portion of the groove 2 to a level above an opening thereof. The capacitor insulation film 4 has a three-layered structure of $SiO_2/Si_3N_4/SiO_2$. A trenched capacitor 5 consists of the substrate 1, the groove 2, the capacitor insulation film 4 and the capacitor electrode 3. $N^+$-type source and drain regions 6 and 7 which are electrically isolated from each other are provided in a region of the silicon substrate 1 adjacent to the trenched capacitor 5. A gate electrode 9 formed of a second polycrystalline silicon layer is formed on a gate oxide film 8 in a region of the substrate 1 which includes a portion between the $n^+$-type source and drain regions 6 and 7. A transfer transistor 10 consists of the source and drain regions 6 and 7, the gate oxide film 8 and the gate electrode 9. Furthermore, the source region 6 contacts with the insulation film 4 of the trenched capacitor 5, and the drain region 7 is connected to a bit line (not shown). In FIG. 1, reference numeral 9' denotes a gate electrode of an adjacent memory cell.

However, in the MOS memory cell shown in FIG. 1 described above, when the trenched capacitor of one of two adjacent memory cells is formed closely to the other trenched capacitor, a punch through phenomenon easily occurs, thereby causing interference of data. More specifically, a junction capacitance between a drain and a substrate of a transfer transistor of a momory cell must be decreased so as to decrease a bit line capacitance. For this reason, a concentration of a p-type silicon substrate is decreased, but, a depletion layer is thereby easily formed in a substrate region near a capacitor with the MOS structure, thereby easily causing the punch-through phenomenon. For this reason, a distance between the trenched capacitors of the two adjacent memory cells cannot be shortened, and high density memory cannot therefore be realized. The punch-through phenomenon can be avoided by doping a silicon substrate with impurity ions. However, in the trenched capacitor 5 which has the deep groove 2 in the silicon substrate 1 as shown in FIG. 1, it is difficult to ion-implant an impurity in a deep portion of the substrate 1. Thus, it is difficult to prevent the punch-through phenomenon from occurring between regions near the bottom portions of the two adjacent trenched capacitors. Therefore, in a conventional structure, the trenched capacitors of two adjacent memory cells must be spaced by a large distance from each other, thus preventing a high-density memory cell from being realized.

In the structure of FIG. 1, since a depletion layer extends from the trenched capacitor 5 in a deep portion of the silicon substrate 1, an electric charge generated by irradiation of an α-ray easily concentrates by a funneling phenomenon. For this reason, in this structure, a soft error easily occurs.

SUMMARY OF THE INVENTION

It is an object of the present invention to provide a semiconductor memory device which comprises a trenched capacitor having a large capacitance per unit area, and in which a distance between two trenched capacitors can be shortened while preventing soft errors from occurring.

According to the invention, there is provided a semiconductor memory device comprising:

a semiconductor body provided with a groove extending from a major surface to a position inside thereof, said semiconductor body including a first impurity diffused semiconductor region which defines said groove and a second impurity diffused semiconductor region which surrounds said first impurity diffused semiconductor region; and an electrode which is formed from a bottom portion of said groove to a level at least above an opening of said groove through a capacitor insulation film, said first impurity diffused semiconductor region, capacitor insulation film and electrode constituting a trenched capacitor in which said electrode serves as a first capacitor electrode and said first impurity diffused semiconductor region serves as a second capacitor electrode.

According to the invention, there is further provided a semiconductor memory device comprising a semiconductor substrate of a first conductivity type in which a semiconductor layer of a second conductivity type is formed on a surface thereof and which has a higher impurity concentration than that of said semiconductor layer; a groove which is formed to extend from a surface of said semiconductor layer to a position inside said semiconductor substrate through said semiconductor layer; an impurity diffused region of the second conductivity type which is formed on portions of said semiconductor layer and said semiconductor substrate which define said groove; and an electrode which is formed from a bottom portion of said groove to a level at least above an opening of said groove through a capacitor insulation film, said impurity diffused region, capacitor insulation film and electrode constituting a trenched capacitor in which said electrode serves as a first capacitor electrode and said impurity diffused region serves as a second capacitor electrode.

According to the invention, there is still further provided a semiconductor memory device comprising a semiconductor layer of a first conductivity type; a groove which is formed so as to extend from a surface of said semiconductor layer to a position inside thereof; an impurity diffused region of the first conductivity type which is formed on a portion of said semiconductor layer which defines said groove and has a higher impurity concentration than that of said semiconductor layer; an impurity diffused region of a second conductivity type having a shallower junction depth than that of said impurity diffusion region of the first conductivity type; and an electrode which is formed from a bottom portion of said groove to a level at least above an opening of said groove through a capacitor insulation film, said impurity diffused region of the second conductivity type, capacitor insulation film and electrode constituting a trenched capacitor in which said electrode serves as a first capacitor electrode and said impurity diffused region of the second conductivity type serves as a second capacitor electrode.

According to the invention, there is also further provided a semiconductor memory device comprising a semiconductor layer of a first conductivity type; a well region of a second conductivity type which is selectively buried in a surface region of said semiconductor layer; a groove which is formed so as to extend from a surface of said well region to a position inside said semiconductor layer through said well region; an impurity diffused region of the second conductivity type which is formed on portions of said well region and said semiconductor layer which define said groove; an impurity diffused region of the first conductivity type which has a shallower junction depth than that of said impurity diffused region of the second conductivity type which is formed on said portions which define said groove; and an electrode which is formed from said groove to a level at least above an opening of said groove through a capacitor insulation film, said impurity diffused region of the first conductivity type, capacitor insulation film and electrode constituting a trenched capacitor in which said electrode serves as a first capacitor electrode and said impurity diffused region of the first conductivity type serves as a second capacitor electrode.

BRIEF DESCRIPTION OF THE DRAWINGS

FIG. 5 is a plan view showing a dynamic MOS memory according to another embodiment of the present invention;

DETAILED DESCRIPTION OF THE PREFERRED EMBODIMENTS

A first embodiment of the present invention will be described with reference to FIGS. 2 and 3.

Figure 2:
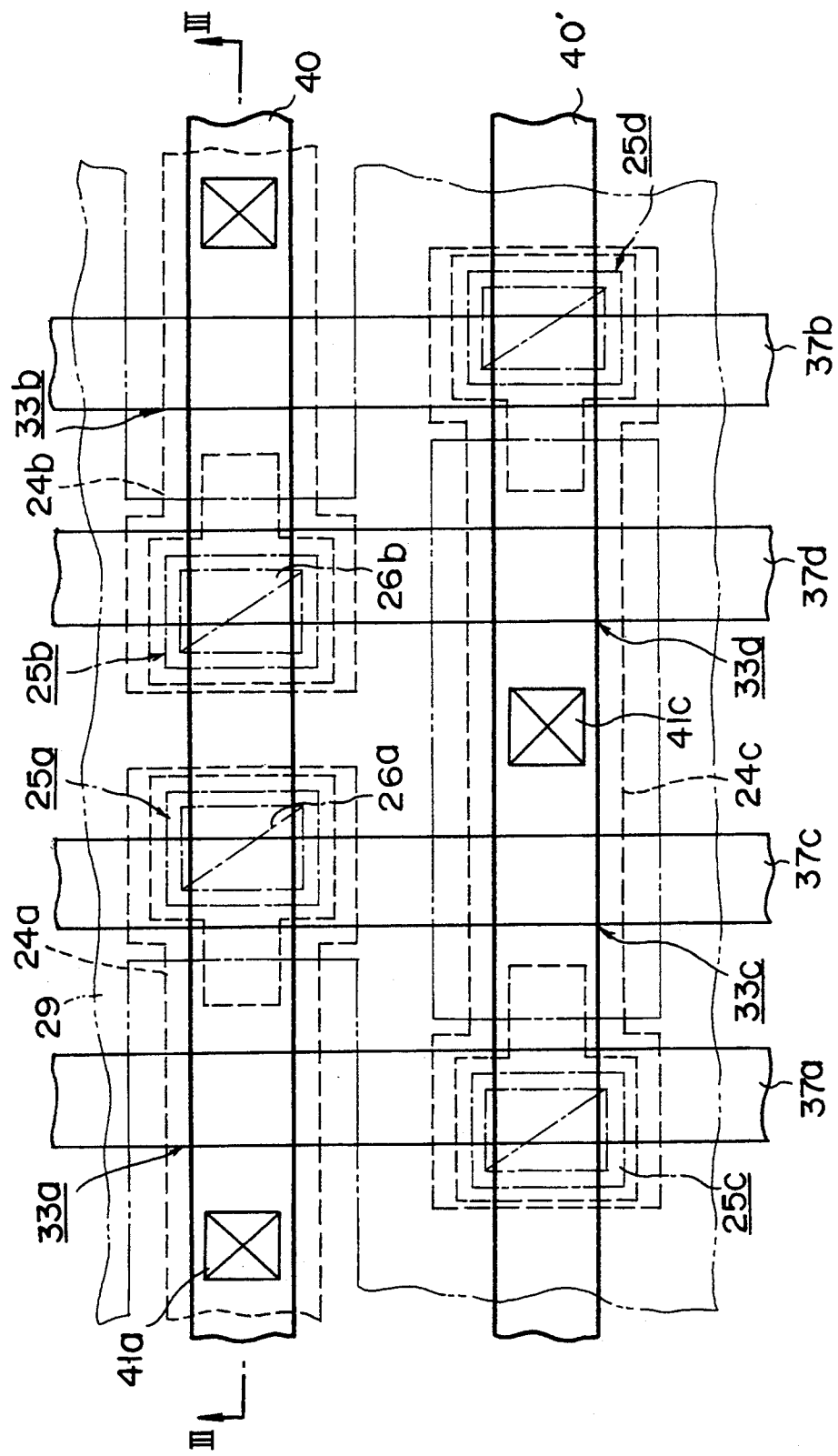
FIG. 2 is a plan view showing a dynamic MOS memory according to an embodiment of the present invention.
Figure 3:
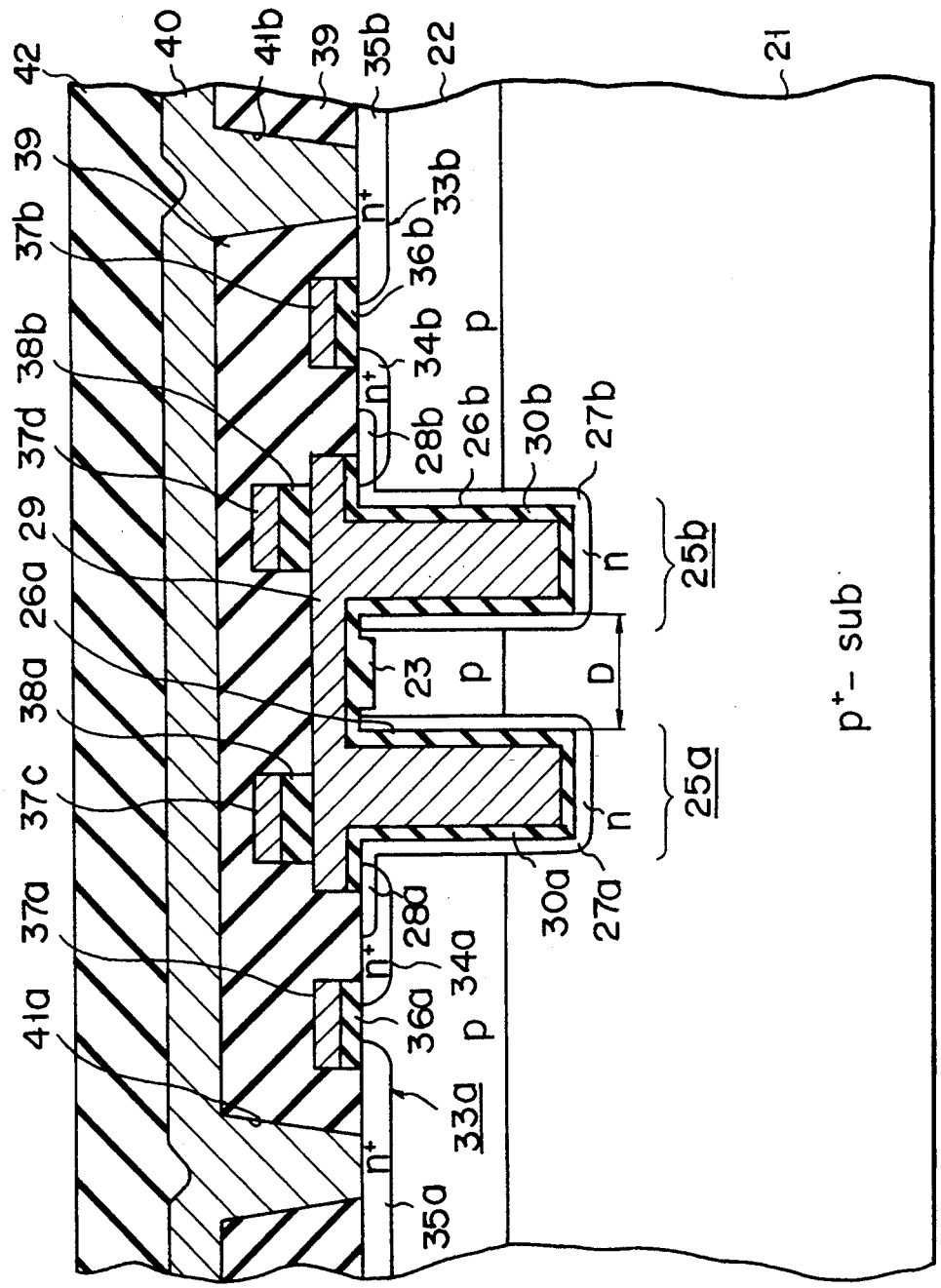
FIG. 3 is a sectional view taken along a line III—III of FIG. 2.

FIG. 2 is a plan view partially showing a dynamic MOS memory, and FIG. 3 is a sectional view taken along a line III—III of FIG. 2. In FIG. 3, reference numeral 21 denotes a p+-type silicon substrate containing a high concentration of boron ions in the amount of $5 \times 10^{17}/cm^3$. A p-type silicon layer 22 containing an acceptor impurity (e.g., boron) in a concentration of $2 \times 10^{15}/cm^3$ is epitaxially grown on a surface of the substrate 21 so as to have a thickness of 2 μm. A field oxide film 23 which has a predetermined pattern of a plurality of patterned holes is formed on the silicon layer 22. A plurality of island regions of the silicon layer 22, which are defined by, that is, surrounded by the patterned holes of the field oxide film 23, form active regions (memory cells) 24a to 24c. Trenched capacitors 25a and 25b are respectively formed on end portions of the active regions 24a and 24b which are close to each other. On the other hand, trenched capacitors 25c and 25d are respectively formed on two end portions of the active region 24c. The trenched capacitor 25a comprises a groove 26a having a depth of, e.g., 3 μm which is formed so as to extend from a surface of the p-type silicon layer 22 to a certain depth of the silicon substrate 21, as shown in FIG. 3. An n-type region 27a in which an n-type impurity (e.g., phosphorus or arsenic) is diffused is formed on portions of the silicon layer 22 and the silicon substrate 21 which define the groove 26a. The n-type region 27a has a depth, i.e. of, e.g., 0.2 μm and an impurity concentration of, e.g., $2 \times 10^{18}/cm^3$. An extended portion 28a is formed in the n-type region 27a so as to extend along the surface of the p-type silicon layer 22 at a side of the trenched capacitor 25a opposite to the capacitor 25b. An electrode 29 which is formed of a first polycrystalline silicon layer and is insulated by a silicon oxide film 30a is formed from a bottom portion of the groove 26a so as to extend to a level at least above an opening thereof. The oxide silicon film 30a serves as a capacitor insulation film and has a thickness of, e.g., about 200 Å. In the trenched capacitor 25a, the electrode 29 serves as a first capacitor electrode and the n-type region 27a serves as a second capacitor electrode. The electrode 29 is a common electrode of the trenched capacitors 25a to 25d. The trenched capacitor 25b has substantially the same structure as that of the capacitor 25a and consists of a groove 26b, an n-type region 27b, the electrode 29 and a silicon oxide film 30b. An extended portion 28b is formed in the n-type region 27b so as to extend along the surface of the silicon layer 22 at a side of the trenched capacitor 25b opposite to the trenched capacitor 25a. Although the trenched capacitors 25c and 25d are not described in detail, they have the same structure as that of the trenched capacitors 25a and 25b.

A method of manufacturing the trenched capacitor according to the first embodiment will be briefly described with reference to FIGS. 4A and 4B.

Figure 4A:
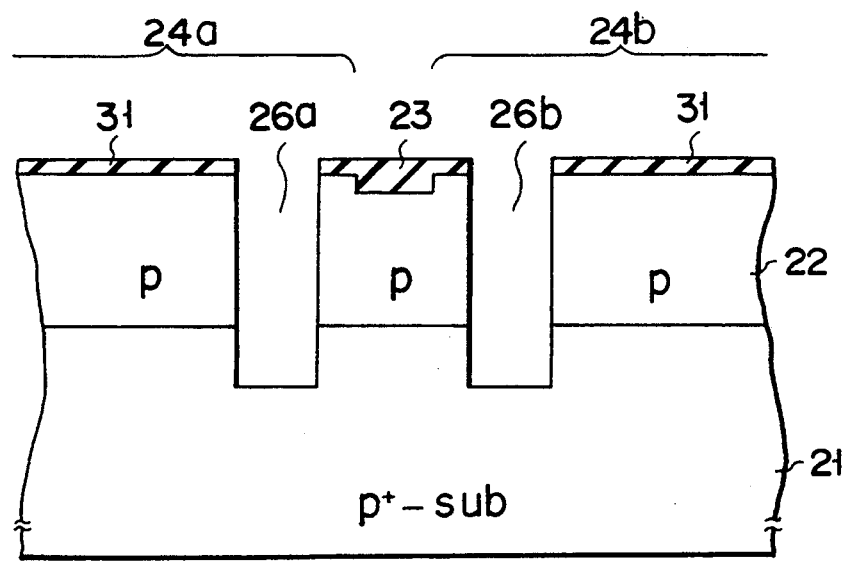
FIGS. 4A and 4B are sectional views respectively showing a structure in the process of forming a trenched capacitor according to the embodiment.

Process 1 (FIG. 4A)

The p-type silicon layer 22 is formed on the p+-type silicon substrate 21 by eptaxial growth. The field oxide film 23 having a predetermined pattern is formed on the silicon layer 22, thereby defining the island active regions 24a and 24b (in FIGS. 4A and 4B, the active region 24c is not shown). An oxide film 31 is formed on the surfaces of the active regions 24a and 24b to a thickness of about 1,000 Å. A photoresist film (not shown) is coated on the overall surface of the resultant structure. Thereafter, the photoresist film is selectively etched by photoetching so as to form a resist pattern (not shown) on a prospective groove forming region of the oxide film 31. Then, the oxide film 31 is selectively etched by reactive etching using the resist pattern as a mask, and the p-type silicon layer 22 and the p+-type silicon substrate 21 are selectively etched to a position inside the substrate 21 so as to form the grooves 26a and 26b respectively having a depth of, e.g., about 3 μm. Thereafter the resist pattern is removed.

Figure 4B:
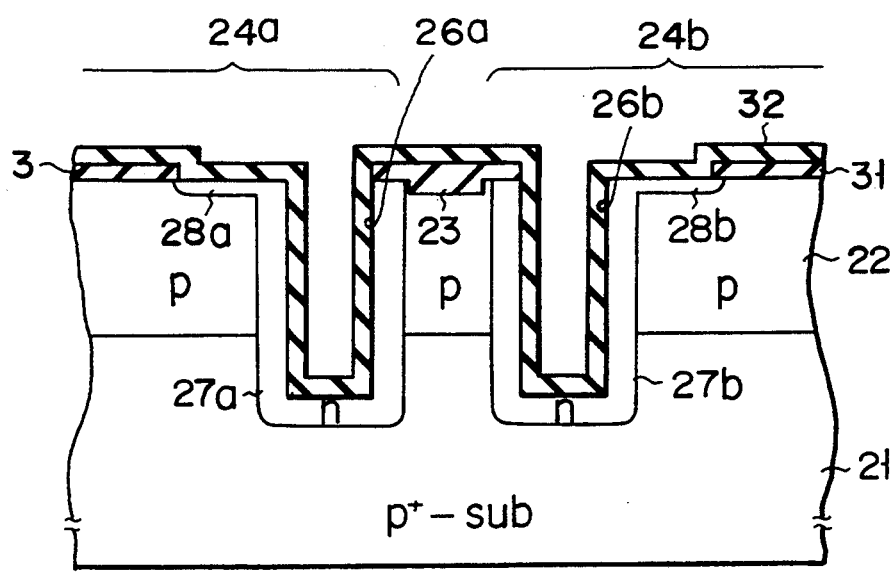

Process 2 (FIG. 4B)

The oxide film 31 corresponding to a portion of a source region of a transfer transistor is selectively removed by photoetching. Thereafter, an n-type impurity, e.g., phosphorus-doped silicon oxide film (or arsenic-doped silicon oxide film or polycrystalline silicon film which is doped with phosphorus, arsenic and the like) 32 is deposited on the overall surface of the resultant structure by a CVD method. Phosphorus is thermally diffused in the p-type silicon layer 22 and the p+-type silicon substrate 21 using the phosphorus-doped silicon oxide film 32 as a diffusion source, thereby forming the n-type regions 27a and 27b and the extended portions 28a and 28b.

Process 3 (not shown)

Thereafter, the phosphorus-doped silicon oxide film 32 and the oxide film 31 are removed. Furthermore, the resultant structure is subjected to a thermal oxidation processing, thereby forming a silicon oxide film on an exposed surface of the substrate 21 and the silicon layer 22, Subsequently, polycrystalline silicon is deposited on the overall surface of the resultant structure, thereby forming the first polycrystalline silicon film. This silicon film is patterned so as to form the electrode 29 extending from the bottom portion of the groove to a level at least above the opening thereof. Then, the silicon oxide film is selectively etched using the electrode 29 as a mask, thereby forming the silicon oxide films 30a and 30b.

Transfer transistors 33a and 33b are formed in regions near the respective trenched capacitors 25a and 25b in the active regions 24a, 24b and 24c. In the same manner, transfer transistors 33c and 33d are formed in regions near the respective trenched capacitors 25c and 25d in the active region 24c. The transfer transistor 33a consists of n+-type source and drain regions 34a and 35a which are provided in regions of the active region 24a close to the capacitor 25a so as to be electrically isolated from each other, and a gate electrode 37a which is formed through a gate oxide film 36a on the active region 24a including at least a portion between the source and drain regions 34a and 34b. The n+-type source region 34a is in contact with the extended portion 28a of the n-type region 27a which constitutes part of the trenched capacitor 25a. The transfer transistor 33b consists of n+-type source and drain regions 34b and 35b, a gate oxide film 36b and a gate electrode 37b, in the same manner as in the transistor 33a. The source region 34b is in contact with the extended portion 28b of the n-type region 27b which constitutes part of the trenched capacitor 25b. Transfer transistors 33c and 33d consist of source and drain regions (neither are shown) and gate electrodes 37c and 37d, respectively, in the same manner as in the transfer transistors 33a and 33b. The gate electrodes 37a and 37b of the transfer transistors 33a and 33b cross the electrode 29 of the trenched capacitors 25c and 25d through an oxide film (not shown). Meanwhile, the gate electrodes 37c and 37d of the transfer transistors 33c and 33d cross the electrode 29 of the trenched capacitors 25a and 25b through the oxide films 38a and 38b. Furthermore, an interlayer insulation film 39 is formed on the trenched capacitors 25a to 25d and the silicon layer 22 including the transfer transistors 33a to 33d. A pair of bit lines 40 and 40' formed of, e.g., Al, are formed on the interlayer insulation film 39 along a direction perpendicular to the gate electrodes 37a to 37d. One bit line 40 is connected to the drain regions 35a and 35b of the transfer transistors 33a and 33b through contact holes 41a and 41b. The other bit line 40' is connected to a common drain region (not shown) of the transfer transistors 33c and 33d through a contact hole 41c. A protective insulation film 42 is formed on the interlayer insulation film 39 including the bit lines 40 and 40'.

Figure 1:
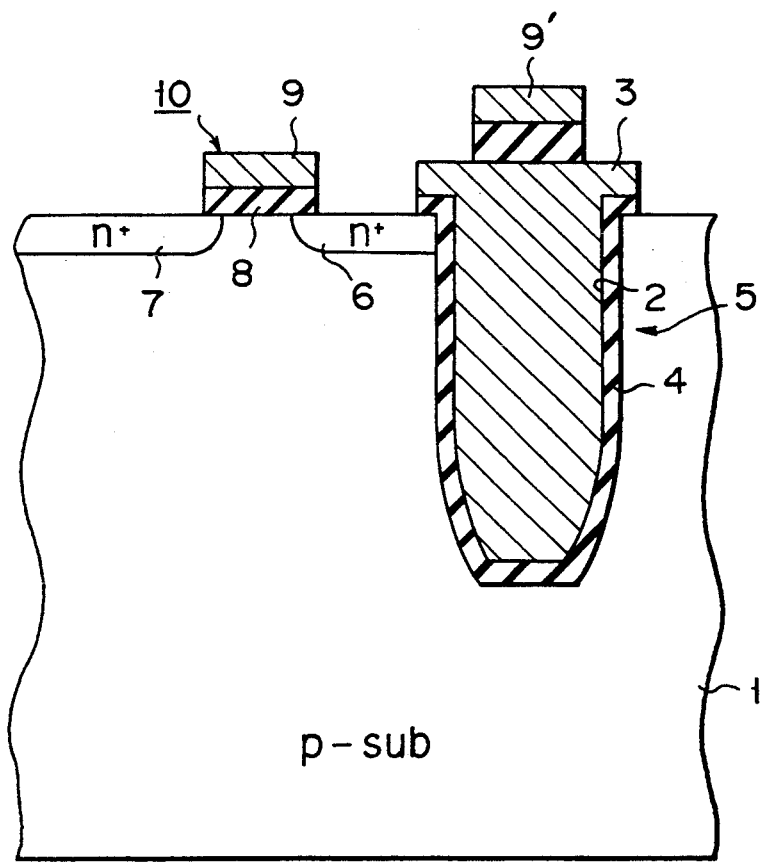
FIG. 1 is a sectional view showing a conventional dynamic MOS memory.

Therefore, as stated in the semiconductor memory device according to the above embodiment, portions of the n-type regions 27a and 27b in the deep section of the grooves which construct memory nodes of the trenched capacitors (e.g., 25a and 25b) are situated in the p+-type silicon substrate 21 having an impurity concentration of about $5 \times 10^{17}/cm^3$. Due to the presence of the p+-type silicon substrate 21, formation of depletion layers in the deep portions of the trenched capacitors 25a and 25b can be considerably prevented. In fact, when a difference between a potential at the memory nodes, i.e., the n-type regions 27a and 27b and that at the p+-type silicon substrate 21 and the p-type silicon layer 22 is 5 V, a width of each of the depletion layers respectively extending from the regions of the n-type regions 27a and 27b in the substrate 21 was about 0.13 μm. When acceptor-impurity ions are implanted and diffused in a lower portion of the field oxide film 23 of the silicon layer 22, a width of each of depletion layers extending from the n-type regions 27a and 27b in the silicon layer 22 is controlled to be about 0.2 μm even at a potential difference of 5 V. As a result, even when the trenched capacitors 25a and 25b are separated by up to 0.6 μm, no punch through phenomenon occurs. In the conventional structure of the trenched capacitor 5 shown in FIG. 1, when the two trenched capacitors are spaced by about 2 μm, the punch through phenomenon occurs. This results in an improvement of more than three times in terms of distance. Therefore, a high density memory can be realized. Furthermore, in the above embodiment, a junction capacitance of the bit line is not increased at all.

Since the deep portion of the trenched capacitor (e.g., 25a) is situated in the p+-type silicon substrate 21 having a high impurity concentration, a lifetime of carriers in this portion is shortened. Therefore, this prevents concentration of the carriers generated by irradiation of an α-ray in the n-type region 27a by the funneling phenomenon, thereby realizing a memory having a good anti-soft error property.

Furthermore, in the above embodiment, p-n junction capacitances between the p+-type silicon substrate 21 and the p-type silicon layer 22 and the n-type region 27a are superposed on a capacitance between the n-type region 27a and the electrode 29. For this reason, a trenched capacitor having a high capacitance per unit area can be realized and a high density memory can be also realized. In practice, it is found that the p-n junction capacitance reaches about 30% of the capacitance between the n-type region 27a and the electrode 29.

In the above embodiment, the silicon oxide film is used as the capacitor insulation film. However, the present invention is not limited to this. For example, a three-layered film in which a silicon nitride film is sandwiched by silicon oxide films or a two-layered film of silicon oxide and tantalum oxide can be used.

In the above embodiment, the p+-type silicon substrate is used as a semiconductor substrate and the p-type silicon layer is used as a semiconductor layer. However, an n+-type silicon substrate and an n-type silicon layer can be used. In this case, an impurity diffusion region becomes p-type and a transfer transistor becomes a p-channel MOS transistor.

In the above embodiment, the dynamic MOS memory is described as an example. However, the present invention can be applied to a static MOS memory in the same manner as described above. In this case, the above-mentioned trenched capacitor can be provided in a bistable node of a cell of flip-flop type.

A second embodiment of the present invention will be described with reference to FIGS. 5 and 6. In this embodiment, the silicon layer 22 in the first embodiment is omitted. A trenched capacitor and a transfer transistor are formed so as to extend in a substrate. Therefore, the elements formed in the silicon layer 22 in the first embodiment are formed in the substrate in the second embodiment and the elements formed on the silicon layer 22 in the first embodiment are formed on the substrate in the second embodiment. Note that the same reference numerals as in the first embodiment denote the same parts as in the second embodiment.

Figure 6:
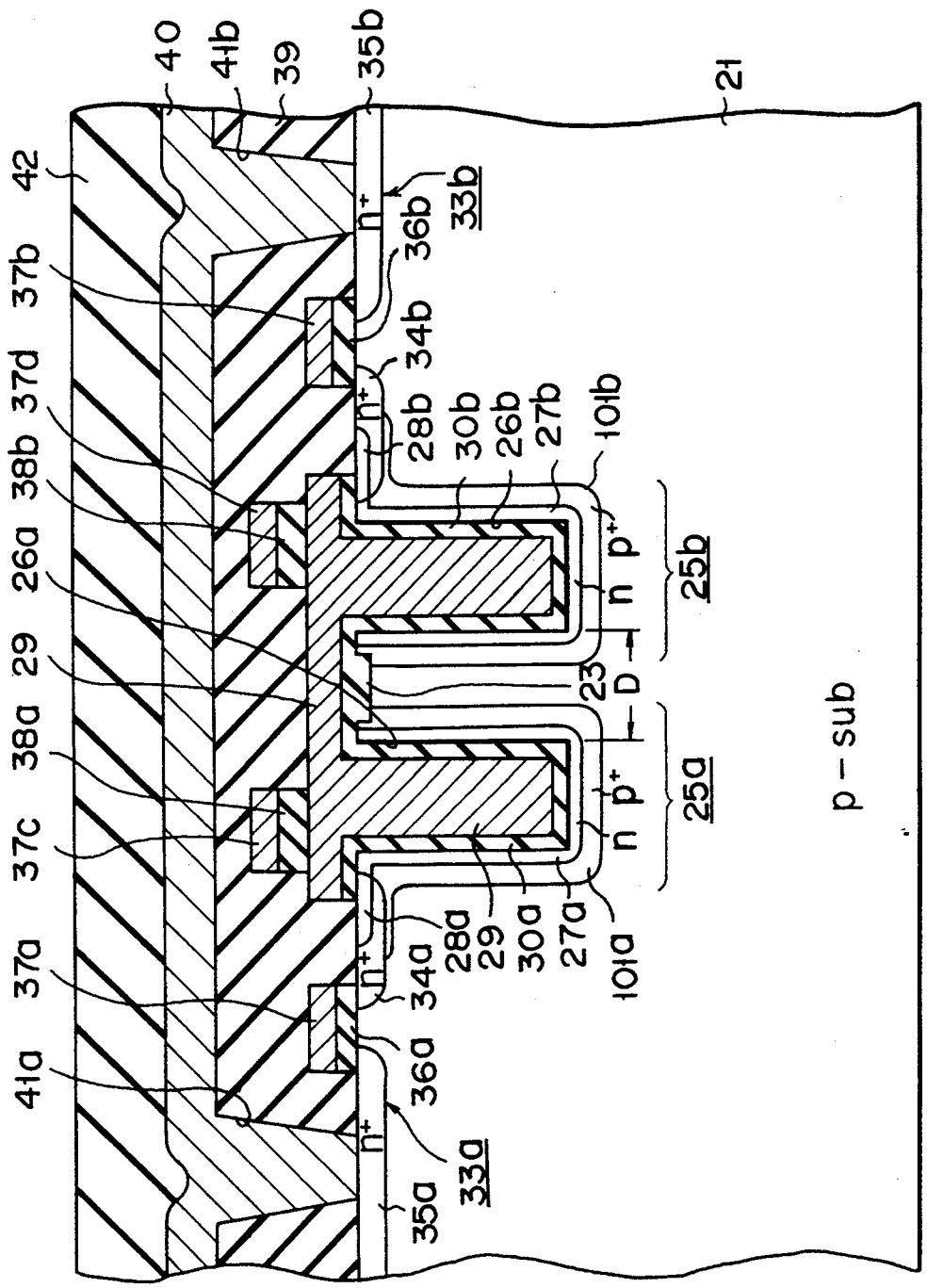
FIG. 6 is a sectional view taken along a line VI—VI of FIG. 5.

FIG. 5 is a plan view partially showing a dynamic MOS memory, and FIG. 6 is a sectional view taken along a line VI—VI of FIG. 5. In FIGS. 5 and 6, reference numeral 21 denotes a p-type silicon substrate containing an acceptor impurity (e.g., boron) in a concentration of $2 \times 10^{15}/cm^3$. A field oxide film 23 of a predetermined pattern having a plurality of patterned holes is formed on the silicon substrate 21. A plurality of island regions of the silicon substrate 21 which are defined by, that is, surrounded by the patterned holes of the field oxide film 23 form active regions (memory cell regions) 24a to 24c. trenched capacitors 25a and 25b are respectively formed close together in end portions of the active regions 24a and 24b. Trenched capacitors 25c and 25d are respectively formed at two end portions of the active region 23c. The trenched capacitors 24a and 24b are arranged so as to be adjacent to each other. A groove 26a having a depth of, for example, 3 μm is formed in the trenched capacitor 25a so as to extend from a surface of the silicon substrate 21 to a position inside thereof, A p+-type region 101a in which a p-type impurity. (e.g., boron) is diffused is formed on a portion of the silicon substrate 21 which defines the groove 26. The p+-type region 101a has a thickness of, for example, 0.4 μm, and has a higher concentration of boron, e.g., $2 \times 10^{17}/cm^3$, than that of the substrate 21. An n-type diffusion region 27a in which an n-type impurity (e.g., phosphorus, arsenic or the like) is diffused is formed on a portion of the p+-type region 101a, which defines the groove 26a, so as to be shallower, that is, thinner than the p+-type diffusion region 101a. The n-type diffusion region 27a has a thickness of, e.g., 0.2 μm and an impurity concentration of, e.g., $1 \times 10^{18}/cm^3$. The n-type diffusion region 27a has an extended portion 28a extending along the surface of the silicon substrate 21 at a side of the trenched capacitor 25a opposite to the trenched capacitor 25b. An electrode 29, which is formed of a first polycrystalline silicon layer, is formed as a capacitor insulation film from a bottom portion of the groove 26a to a level above an opening of the groove 26a through a silicon oxide film 30a having a thickness of, e.g., 200 Å. In the trenched capacitor 25a, the electrode 29 serves as a first capacitor electrode and the n-type diffusion region 27a serves as a second capacitor electrode. The electrode 29 also serves as a common electrode of the trenched capacitors 25a to 25d. The trenched capacitor 25b has substantially the same structure as that of the capacitor 25a, and consists of a groove 25b, a p+-type region 101b, an n-type diffusion region 27b, the electrode 29 and a silicon oxide film 30b. An extended portion 28b is formed in the n-type diffusion region 27b so as to extend along the surface of the silicon substrate 21 at a side of the trenched capacitor 25b opposite to the trenched capacitor 25a. Although the trenched capacitors 25c and 25d are not shown in detail, these comprise the same structure as that of the trenched capacitors 25a and 25b.

A method of manufacturing the trenched capacitor according to the second embodiment will be briefly described with reference to FIGS. 7A to 7C.

Figure 7A:
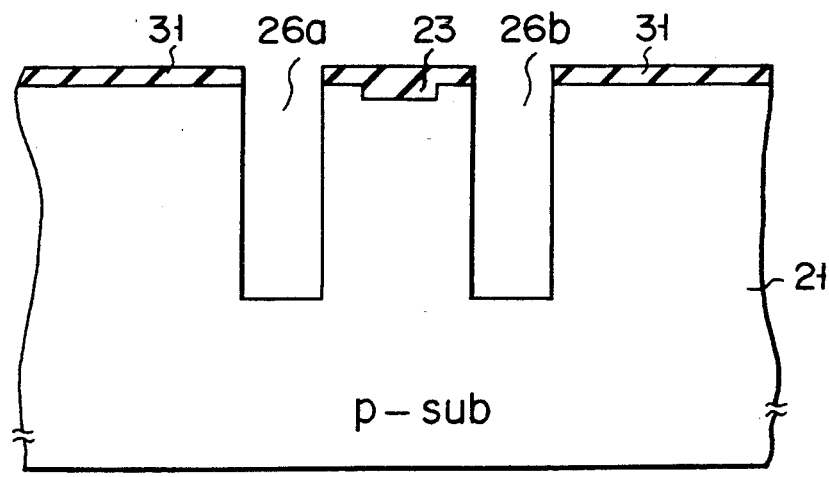
FIGS. 7A to 7C are sectional views respectively showing a structure in the process of forming the trenched capacitor according to another embodiment of the present invention.

Process 1 (FIG. 7A)

The field oxide film 23 having a predetermined pattern is formed on the p-type silicon substrate 21 so as to define the island active regions 24a and 24b (23c is not shown). Thereafter, an oxide film 31 is deposited on surfaces of the active regions 24a and 24b to a thickness of about 1,000 Å. A resist pattern (not shown) is formed on a prospective groove forming region of the oxide film 31. The silicon substrate 21 is selectively etched by reactive ion etching using the resist pattern as a mask, thereby forming the grooves 26a and 26b respectively having a depth of, e.g., 3 μm. Thereafter, the resist pattern is removed.

Figure 7B:
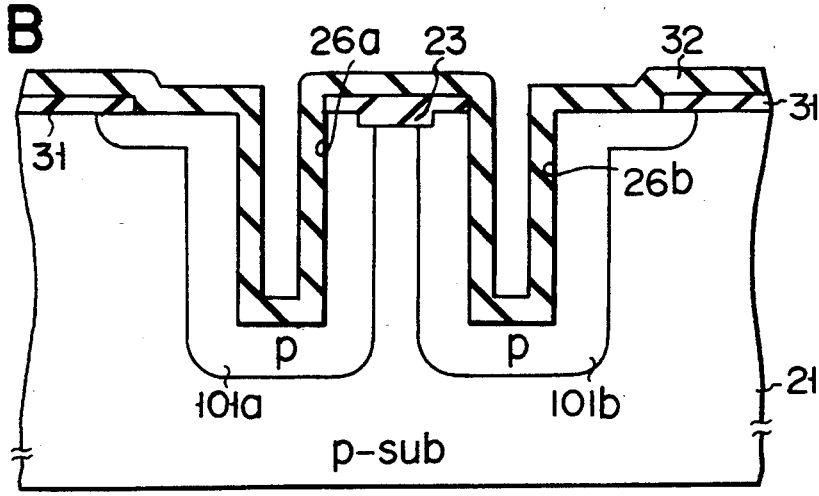

Process 2 (FIG. 7B)

A region of the oxide film 31 corresponding to a portion of the source region of the transfer transistor is removed by photoetching. Thereafter, a silicon oxide film (or polycrystalline silicon film) 32 which is doped with a p-type impurity, e.g., boron, is deposited by a CVD method on the overall surface of the resultant structure. Boron is thermally diffused in the p-type silicon substrate using the boron-doped silicon oxide film 32 as a diffusion source so as to form the p+-type regions 101a and 101b.

Figure 7C:
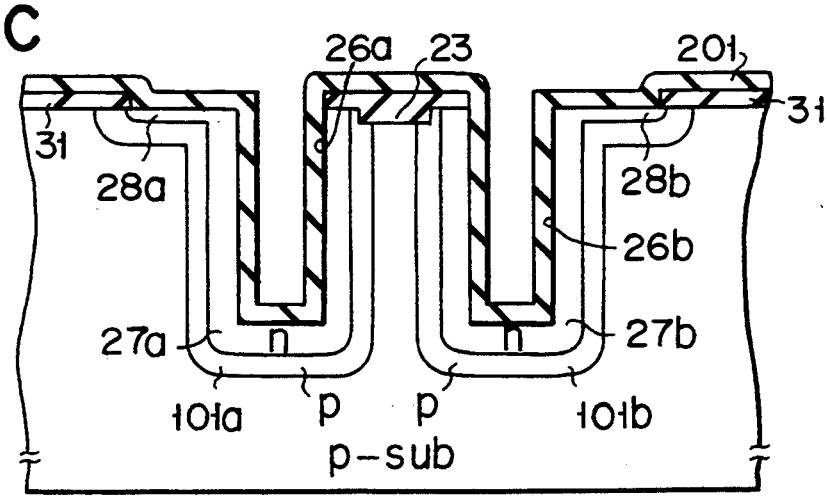

Process 3 (FIG. 7C)

The boron-doped silicon oxide film 32 is removed. A phosphorus-doped silicon oxide film (or an arsenic-doped silicon oxide film, or a polycrystalline silicon film in which phosphorus, arsenic and the like is doped) 201 is deposited by a CVD method on the overall surface of the resultant structure. Thereafter, phosphorus is thermally diffused in the p+-type regions 101a and 101b using the phosphorus-doped silicon oxide film 201 as a diffusion source so as to form the extended portions 28a and 28b and the n-type diffusion regions 27a and 27b. Process 4 (not shown)

Since the Process 4 is substantially the same as the Process 3 in the first embodiment, a detailed description thereof is omitted. Note that the regions 101a and 27a are formed by a double diffusion method. Also, transfer transistors 33a to 33d and a multilayer structure on the silicon substrate 21 are substantially the same as those of the first embodiment, and a detailed description thereof is omitted. In the same manner as in the first embodiment, an n+-type source region 34a is in contact with the extended portion 28a of the n-type diffusion region 27a which constitutes part of the trenched capacitor 25a. Similarly, the source region 34b is in contact with the extended portion 28b of the n-type diffusion region 27b which constitutes part of the trenched capacitor 25b.

In this manner, according to the memory device of the second embodiment, the n-type diffusion regions 27a and 27b which construct memory nodes of the trenched capacitors (e.g., 25a and 25b) are surrounded by the p+-type regions 101a and 101b respectively having an impurity concentration of about $2 \times 10^{17}/cm^3$. Since the p+-type regions 101a and 101b are formed, formation of depletion layers extending from the trenched capacitors 25a and 25b to the silicon substrate 21 can be considerably controlled. In fact, when a difference between a potential at the memory nodes, i.e., the n-type diffusion regions 27a and 27b and that at the p-type silicon substrate 21 was 5 V, a width of the depletion layer extending between the p+-type region 101a and the n-type diffusion region 27a and that extending between the p+-type region 101b and the n-type diffusion region 27b was respectively about 0.2 μm. As a result, even when a distance D between the trenched capacitors 25a and 25b is close to 0.6 μm at which point the p+-type regions 101a and 101b overlap, no punch through phenomenon between the capacitors 25a and 25b occurs. In addition to this, in this embodiment, the junction capacitance of the bit line is not increased. Therefore, a high-density memory can be realized.

In the trenched capacitor, e.g., 25a, formation of a depletion layer extending to the substrate 21 can be prevented by the p+-type region 101a. Since the p+-type region 101a serves as a potential barrier, this can prevent the concentration of carriers generated by irradiation of an α-ray in the n-type diffusion layer of the trenched capacitor 25a by the funneling phenomenon, thereby realizing a semiconductor memory device having a good anti-soft error property.

Furthermore, in the above embodiment, p-n junction capacitances between the p+-type region 101a and the n-type diffusion layer 27a are superposed on a capacitance between the n-type diffusion region 27a and the electrode 29 through the silicon oxide film 30a. For this reason, the trenched capacitor 25a having a high capacitance per unit area can be realized, and a high-density memory cell can also be realized. In practice, it is found that the p-n juntion capacitance reaches about 30% of the capacitance.

In the second embodiment, the silicon oxide film is used as the capacitor insulation film. However, the present invention is not limited to this. For example, in the same manner as in the first embodiment, a three-layered film in which a silicon nitride film is sandwiched by silicon oxide films, a silicon nitride film or a two-layered film of silicon oxide and tantalum oxide can be used.

Furthermore, in the second embodiment, a p-type silicon substrate is used as a semiconductor substrate, but an n-type silicon substrate can be used instead. In this case, the first conductive type impurity diffusion region becomes n-type, the second conductive type impurity diffusion region becomes p-type, and the transfer transistor becomes a p-channel MOS transistor.

In the second embodiment, the dynamic MOS memory is described as an example. However, the present invention can be applied to a static MOS memory. In this case, the above-mentioned trenched capacitor may be provided in a bistable node of a cell of flip-flop type.

A third embodiment of the present invention will be described with reference to FIGS. 8 to 10 hereinafter. In this embodiment, unlike the second embodiment, a well region is formed in a substrate. In addition, a trenched capacitor having substantially the same structure as in the second embodiment is formed so as to extend through this well region into the substrate, and a transfer transistor is formed in the well region. In the third embodiment, the elements formed in the substrate 21 in the second embodiment are formed in the well region, and the structure formed on the substrate 21 in the second embodiment is formed on the well region. In the third embodiment, the same reference numerals as in the second embodiment denote the same parts.

Figure 8:
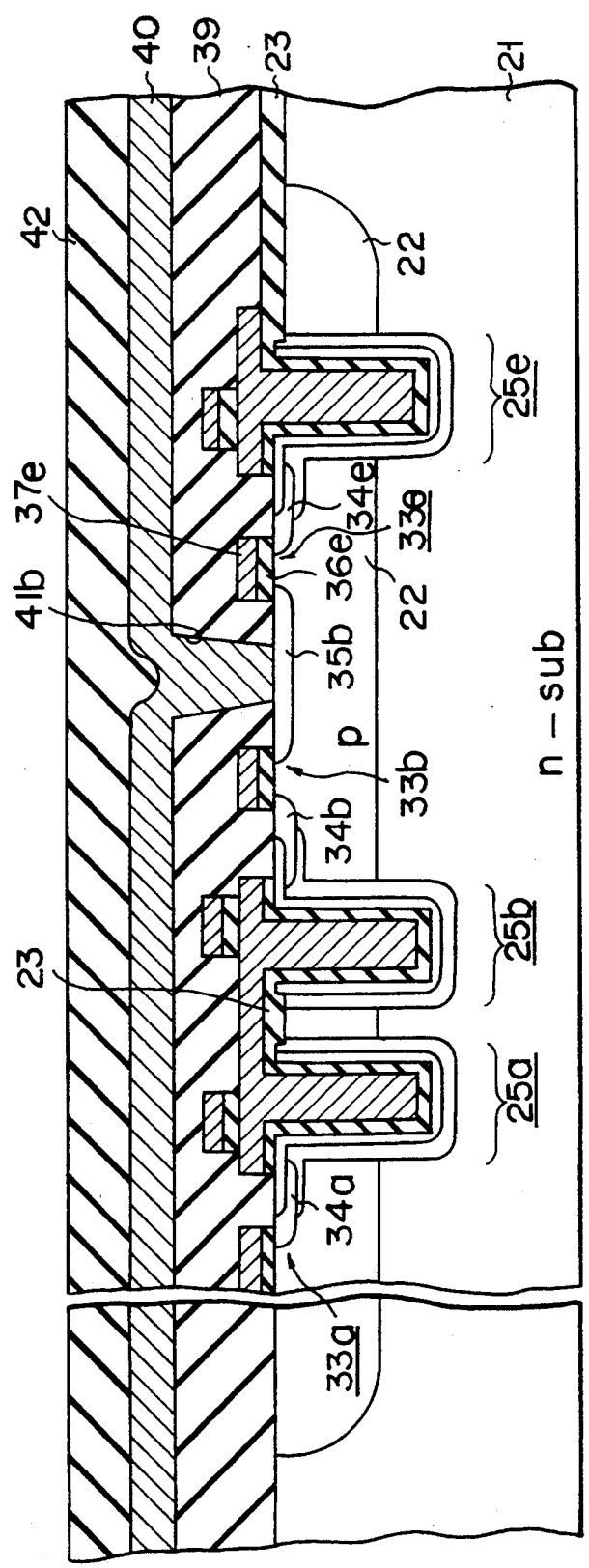
FIG. 8 is a sectional view showing a dynamic MOS memory according to still another embodiment of the present invention.
Figure 9:
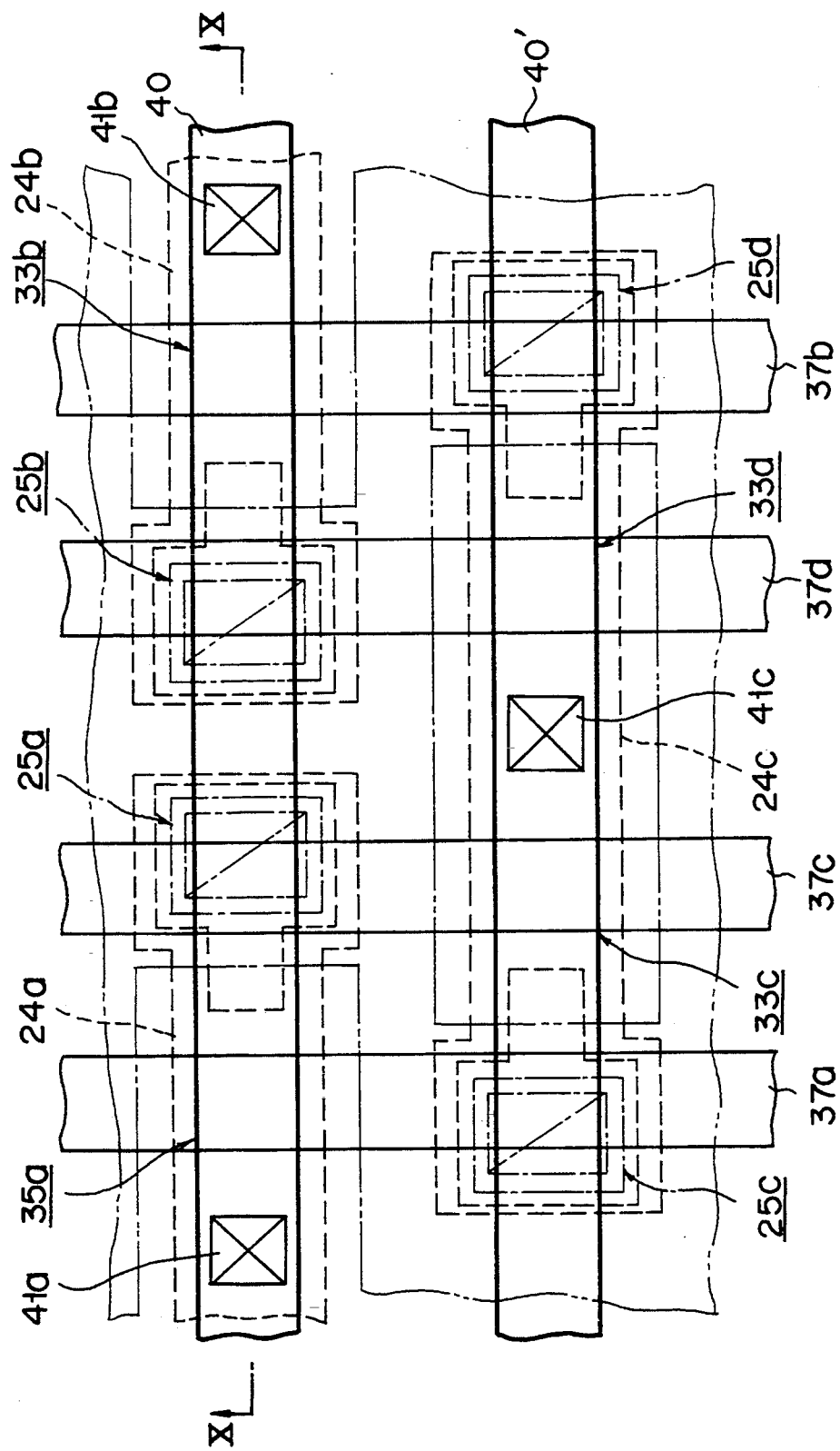
FIG. 9 is a plan view showing a main part of FIG. 8.
Figure 10:
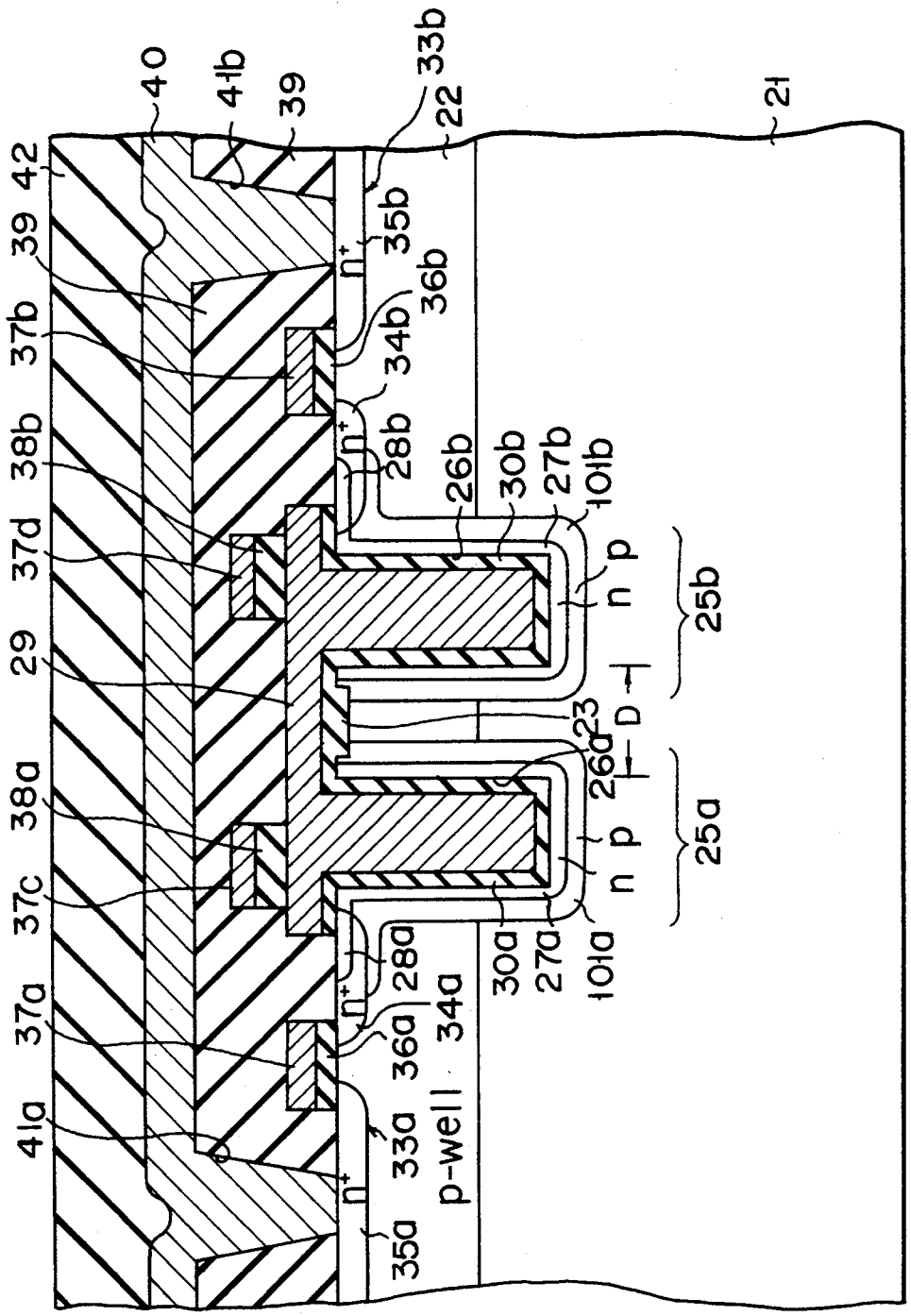
FIG. 10 is a sectional view taken along a line X—X.

FIG. 8 is a sectional view partially showing a dynamic MOS memory, FIG. 9 is a plan view showing a main part of FIG. 8, and FIG. 10 is a sectional view taken along a line X—X of FIG. 9. In FIGS. 8 to 10, reference numeral 21 denotes an n-type silicon substrate containing a doner impurity such as phosphorus in a concentration of $8 \times 10^{14}/cm^3$ as a first conductive type semiconductor layer. A p-type well region 22 containing an acceptor impurity (boron) in a concentration of, e.g., $1 \times 10^{16}/cm^3$ and having a depth of 2 μm is selectively formed in a surface layer of the silicon substrate 21. A field oxide film 23 of a predetermined pattern having a plurality of patterned holes is formed on the well region 22 to a thickness of, e.g., about 0.6 μm. A plurality of island regions of the well region 22 which are defined by the pattern holes of the field oxide film 23 form active regions (memory cell regions) 24a to 24c. Trenched capacitors 25a and 25b are respectively formed on end portions of the active regions 24a and 24b which are close to each other. Tranched capacitors 25c and 25d are formed on two end portions of the active region 24c. A groove 26a having a depth of, e.g., 3 to 5 μm is formed so as to extend from a surface of the well region 22 to a position inside the silicon substrate 21 through the well region 22. A p-type diffusion region 101a is formed on portions of the well region 22 and the silicon substrate 21 which define the groove 26a. The p-type diffusion region 101a has a depth of, e.g., 0.5 μm and a higher impurity concentration of, e.g., $2 \times 10^{17}/cm^3$ than that of the well region 22. An n-type diffusion region 27a in which a doner impurity, i.e., a p-type impurity, is diffused is formed on the portion of the p-type diffusion region 101a which defines the groove 26a so as to have a shallower, i.e., lower thickness than that of the region 101a. The n-type diffusion region 27a has a depth of, e.g., about 0.2 μm and an impurity concentration of, e.g., $1 \times 10^{18}/cm^3$. An extended portion 28a is formed in the n-type diffusion region 27a so as to extend along the surface of the well region 22 at a side of the capacitor 25a opposite to the trenched capacitor 25b. An electrode 29 of a first polycrystalline silicon layer is formed from a bottom portion of the groove 26a to a level at least above an opening of the groove 26a through a silicon oxide film 30a of a thickness of about 200 Å which serves as a capacitor insulation film. In the trenched capacitor 25a, the electrode 29 serves as a first capacitor electrode and the n-type diffusion layer 27a serves as a second capacitor electrode. The electrode 29 also serves as a common electrode of the trenched capacitors 25a to 25d. The trenched capacitor 25b has substantially the same structure as that of the capacitor 25a, and consists of a groove 26b, a p-type diffusion region 101b, an n-type diffusion region 27b, the electrode 29 and a silicon oxide film 30b. An extended portion 28b is formed in the n-type diffusion region so as to extend along the surface of the well region 22 at a side of the capacitor 25b opposite to the trenched capacitor 25a. Both the trenched capacitors 25c and 25d are not shown in detail, but have the same structures as those of the trenched capacitors 25a and 25b. Note that another trenched capacitor 25e having the same structure described above is formed in an end portion of the well region 22.

A method of manufacturing the trenched capacitor will be briefly described with reference to FIGS. 11A to 11C.

Figure 11A:
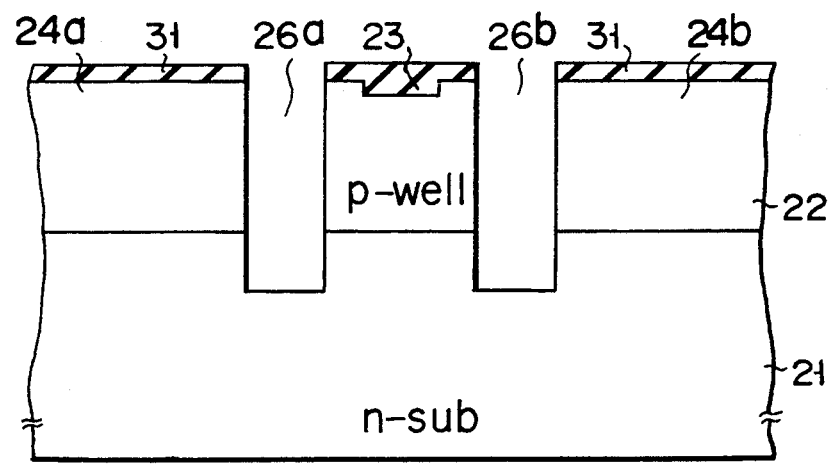
FIGS. 11A to 11C are sectional views respectively showing a structure in the process of forming the trenched capacitor according to still another embodiment.

Process 1 (FIG. 11A)

The p-type well region 22 is selectively formed in the surface region of the n-type silicon substrate 21. Thereafter, the field oxide film 23 having a predetermined pattern is formed on the surface of the well region 22 so as to define the island active regions 24a and 24b (24c is not shown). Then, an oxide film 31 of a thickness of about 1,000 Å is formed on surfaces of the active regions 24a and 24b. Subsequently, a resist pattern (not shown) is formed on a portion of a prospective groove forming region of the oxide film 31. The well region 22 is selectively etched by reactive ion etching using the resist pattern as a mask from the surface of the well region 22 into the silicon substrate 21, thereby forming the grooves 26a and 26b having a depth of 3 to 5 μm. Thereafter, the resist pattern is removed.

Figure 11B:
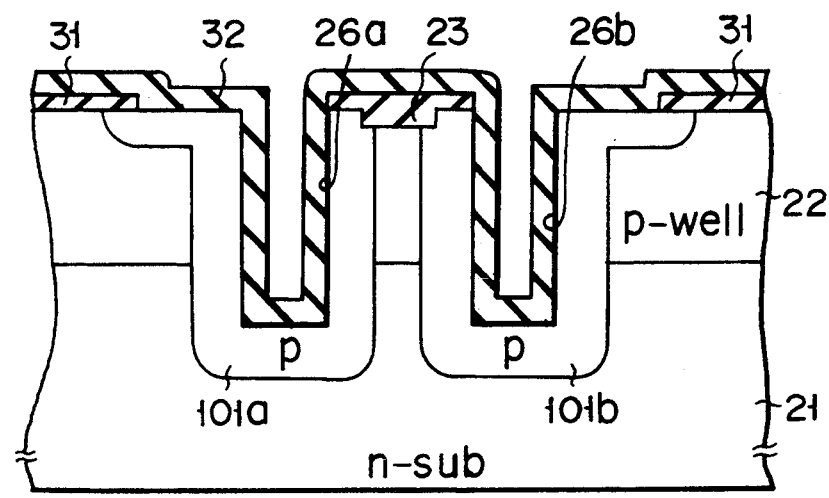

Process 2 (FIG. 11B)

The oxide film 31 corresponding to a portion of a source region of a transfer transistor is etched by photoetching. Thereafter, a silicon oxide film (or polycrystalline silicon film) 32 which is doped with a p-type impurity, e.g., boron, is deposited on the overall surface of the resultant structure by a CVD method. Then, boron is thermally diffused in the p-type well region 22 and the n-type silicon substrate 21 using the boron-doped silicon oxide film 32 as a diffusion source, thereby forming the p-type diffusion regions 101a and 101b.

Figure 11C:
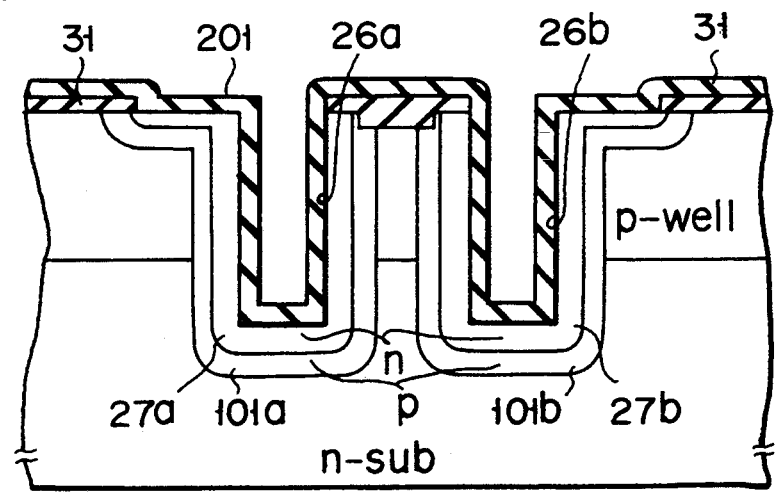

Process 3 (FIG. 11C)

The boron-doped silicon oxide film 32 is removed. Then, a phosphorus-doped silicon oxide film (or an arsenic-doped silicon oxide film, or a polycrystalline silicon film in which phosphorus or arsenic is doped) 201 is deposited on the overall surface of the resultant structure by a CVD method. Thereafter, phosphorus is thermally diffused in the p-type diffusion regions 101a and 101b using the phosphorus-doped silicon oxide film 201 as a diffusion source so as to form the n-type diffusion regions 27a and 27b and the extended portions 28a and 28b in the diffusion regions 101a and 101b, respectively.

Process 4 (not shown)

The Process 4 is substantially the same as the Process 4 as in the second embodiment, and a detailed description thereof is omitted. Note that the regions 101a and 27a are formed by a double diffusion method. Since transfer transistors 33a to 33d and a multilayer structure on the substrate 21 are substantially the same as in the first and second embodiments, a detailed description thereof is also omitted. It should be noted that in the same manner as in the first and second embodiments, an n+-type source region 34 is in contact with the extended portion 28a of the n-type diffusion region 27a which constitutes part of the trenched capacitor 25a. Similarly, a source region 34b is in contact with the extended portion 28b of the n-type diffusion region 27b which constitutes part of the trenched capacitor 25b. Note that a transfer transistor 33e is formed on an end portion of the well region 22. The transfer transistor 33e consists of an n+-type source region 34e, an n-type drain region (a drain region 35b of the transfer transistor 33b is commonly used), and a gate electrode 37e which is formed on a portion of the well region 22 including a portion between the source and drain regions 34e and 35b. Gate electrodes 37a and 37b of the transfer transistors 33a and 33b cross the common electrode 29 of the trenched capacitors 25c and 25d through an oxide film (not shown). Gate electrodes 37c and 37d of the transfer transistors 33c and 33d cross the common electrode 29 of the trenched capacitors 25a and 25b through oxide films 38a and 38b.

Furthermore, an interlayer insulation film 39 is coated on the well region 22 including the trenched capacitors 25a to 25e and the transfer transistors 33a to 33e and the silicon substrate 21. Bit lines 40 and 40' are formed on the interlayer insulation film 39 along a direction perpendicular to the gate electrodes 37a to 37e. One bit line 40 is connected to the drain region 35a of the transfer transistor 33a and the common drain region 35b of the transfer transistors 33b and 33e through contact holes 41a and 41b, respectively. The other bit line 40' is connected to the common drain region (not shown) of the transfer transistors 33c and 33d through a contact hole 41c. A protective insulation film 42 is coated on the interlayer insulation film 39 including the bit lines 40 and 40'.

In this manner, according to the semiconductor memory device of the third embodiment, the n-type diffusion regions 27a and 27b constructing memory nodes of the trenched capacitor, e.g., 25a and 25b are surrounded by the p-type diffusion regions 101a and 101b having an impurity concentration of about $2 \times 10^{17}/cm^3$. Since the p-type diffusion regions 101a and 101b are formed, formation of depletion layers extending from the trenched capacitors 25a and 25b to the p-type well region 22 can be prevented. In fact, when a difference between a potential at the memory nodes, that is, the n-type regions 27a and 27b and that at the p-type well region 22 was 5 V, a width of the depletion layer extending between the p-type diffusion region 101a and the n-type diffusion region 27a, and that extending between the p-type diffusion region 101b and the n-type diffusion region 27b were respectively about 0.2 μm. As a result, even when a distance between the trenched capacitors 25a and 25b is close to 0.6 μm, at which point the p-type diffusion regions 101a and 101b overlap, no punch-through phenomenon between the capacitors 25a and 25b occurs. Furthermore, in the third embodiment, a junction capacitance of the bit line is not increased. Therefore, a high-density memory can be realized.

The grooves 26a to 26e which constitute part of the trenched capacitors 25a to 25e, respectively can extend from the surface of the well region 22 to a position inside the substrate 21 through the well region 22. Furthermore, in the trenched capacitor 25a, a p-n junction capacitance between the p-type diffusion region 101a and the n-type diffusion region 27a is superposed on a capacitance between the n-type diffusion region 27a and the electrode 29. For this reason, the trenched capacitor 25a having a high capacitance per unit area can be provided, and a high-density memory can be realized. In fact, it is found that the p-n junction capacitance reaches 30% of the capacitance when the silicon oxide film 30a of a thickness of 200 Å is used as the capacitor insulation film.

Furthermore, the p-type well region 22 is formed on the surface of the n-type silicon substrate 21, and the p-type diffusion region 101a is provided in an outermost layer of the trenched capacitor 25a. For this reason, since the p-type diffusion region 101a forms a potential barrier around the memory nodes with respect to carriers generated by migration of α-particles, the semiconductor memory device having a good anti-soft error property can be realized.

In the third embodiment, in the same manner as in the first and second embodiments, the silicon oxide film is used as the capacitor insulation film. The present invention is not limited to this. For example, a three-layered film in which a silicon nitride film is sandwiched by silicon oxide films, a silicon nitride film or a two-layered film of silicon oxide and tantalum oxide can be used.

In the third embodiment, the n-type silicon substrate is used as a semiconductor layer, but a p-type silicon substrate can be used. In this case, the impurity diffusion regions 101a and 101b, . . . , are n-type, the impurity diffusion regions 27a, 27b, . . . , are p-type and the transfer transistors 33a, 33b, . . . are p-channel MOS transistors.

In the third embodiment, the dynamic MOS memory is described as an example, but the present invention can be applied to a static MOS memory. In this case, the trenched capacitor described above may be provided in a bistable node of a cell of flip-flop type.

As described above, according to the present invention, a semiconductor memory device having high density and high reliability can be provided which comprises trenched capacitors having a large capacitance per unit area, and in which a distance between the trenched capacitors can be shortened without causing a punch-through phenomenon, thereby realizing a high-density memory cell with an improved anti-soft error property.

What is claimed is:

1. A dynamic semiconductor memory device, comprising:
   a semiconductor substrate of a first conductivity type having a major surface;
   a pair of transfer transistors formed in said semiconductor substrate, each transfer transistor having source and drain regions of a second conductivity type;
   a pair of adjacent trenched capacitors associated with said pair of transfer transistors, each trenched capacitor having a trench formed in said semiconductor substrate extending depthwise from the major surface thereof to a position inside said semiconductor substrate and including:
   a first semiconductor region of the second conductivity type formed in said semiconductor substrate, said first semiconductor region having an impurity concentration less than that of the source and drain regions, defining said trench and forming a first electrode of said trenched capacitor, said first electrode having a first portion disposed between the adjacent trenched capacitors and a second portion extending along the major surface of the substrate in a direction opposite that of the other trenched capacitor and being connected to one of the source and drain regions of a respective one of the pair of transfer transistors;
   a second semiconductor region of said first conductivity type formed in said semiconductor substrate, said second semiconductor region having an impurity concentration higher than that of said semiconductor substrate, said second semiconductor region surrounding the first and second portions of said first semiconductor region;
   an insulation film formed on the surface of each trench and acting as a dielectric of each trenched capacitor;
   a conductive filling in the trench forming the other electrode of the trenched capacitor and forming a first capacitance with said first semiconductor region; and
   a second capacitor having a first electrode and a second electrode, the first semiconductor region forming the first electrode of the second capacitor, the second semiconductor region forming the second electrode of the second capacitor and forming a junction capacitance with the first semiconductor region, and the one of the source and drain regions of the respective transfer transistor forming a node connected to the first electrode of the trenched capacitor and the first electrode of the second capacitor;
   wherein said second semiconductor regions of the trenched capacitors overlap at a superposed portion between the trenched capacitors.

2. A dynamic semiconductor memory device, comprising:
   a semiconductor substrate of a first conductivity type including a well region of a second conductivity type formed therein and defining a major surface;
   a pair of transfer transistors formed in said well region, each transfer transistor having source and drain regions of the first conductivity type;
   a pair of adjacent trenched capacitors associated with said pair of transfer transistors, each trenched capacitor having a trench formed in said well region and said semiconductor substrate extending depthwise from the major surface to a position inside said semiconductor substrate and including:
   a first semiconductor region of the first conductivity type formed in said well region and said semiconductor substrate, said first semiconductor region having an impurity concentration less than that of the source and drain regions, defining said trench and forming a first electrode of said trenched capacitor, said first electrode having a first portion disposed between the adjacent trenched capacitors and a second portion extending along the major surface in a direction opposite that of the other trenched capacitor and being connected to one of the source and drain regions of a respective one of the pair of transfer transistors;

a second semiconductor region of said second conductivity type formed in said semiconductor substrate, said second semiconductor region having an impurity concentration higher than that of said well region, said second semiconductor region surrounding the first and second portions of said first semiconductor region;

an insulation film formed on the surface of each trench and acting as a dielectric of each trenched capacitor;

a conductive filling in the trench forming the other electrode of the trenched capacitor and forming a first capacitance with said first semiconductor region; and a second capacitor having a first electrode and a second electrode, the first semiconductor region forming the first electrode of the second capacitor, the second semiconductor region forming the second electrode of the second capacitor and forming a junction capacitance with the first semiconductor region, and the one of the source and drain regions of the respective transfer transistor forming a node connected to the first electrode of the trenched capacitor and the first electrode of the second capacitor;

wherein said second semiconductor regions of the trenched capacitors overlap at a superposed portion between the trenched capacitors.

3. A semiconductor memory device according to claim 1, wherein said first semiconductor regions have an impurity concentration higher than that of said second semiconductor regions.

4. A semiconductor memory device according to claim 1, wherein each transfer transistor has source and drain regions and a gate, one of said source and drain regions being connected to said first semiconductor region and the other to a bit line, and said gate being connected to a predetermined potential.

5. A semiconductor memory device according to claim 2, wherein each transfer transistor has drain and source regions and a gate, one of said source and drain regions being connected to said first semiconductor region and the other to a bit line, and said gate being connected to a predetermined potential.

* * * * *

UNITED STATES PATENT AND TRADEMARK OFFICE
CERTIFICATE OF CORRECTION

PATENT NO. : 5,428,236
DATED : June 27, 1995
INVENTOR(S) : Yukimasa Uchida

It is certified that error appears in the above-indentified patent and that said Letters Patent is hereby corrected as shown below:

On the title page, item [54] and Col. 1, line 3 "CAPICITOR" should read --CAPACITOR--.

In the abstract, front page, line 2, after "concentration" insert --in which--;

line 3, before "thereof" insert --a surface--;

line 9, before "level" insert --a--;

line 10, after "through" insert --a--;
    line 12, before "trenched" insert --a--; and
    line 13, before "first" insert --as a--.

Signed and Sealed this

Eleventh Day of March, 1997

*Attest:*

BRUCE LEHMAN

*Attesting Officer*     Commissioner of Patents and Trademarks

UNITED STATES PATENT AND TRADEMARK OFFICE
CERTIFICATE OF CORRECTION

PATENT NO. : 5,428,236
DATED : June 27, 1995
INVENTOR(S) : Yukimasa Uchida

It is certified that error appears in the above-indentified patent and that said Letters Patent is hereby corrected as shown below:

```
Claim 4, column 16, line 16, delete "source and";
                    line 17, delete "drain regions and";
                    line 17, change "one" to --and the other--;
                    line 18, change "connected" to --for connection--;
                    line 18, delete "said first semiconductor";
                    line 19, delete "region and the other"; and
                    line 20, change "connected" to --for connection--.

Claim 5, column 16, line 22, delete "drain and";
                    line 23, delete "source regions and";
                    line 23, change "one" to --and the other--;
                    line 24, change "connected" to --for connection--;
                    line 24, delete "said first semiconductor";
                    line 25, delete "region and the other"; and
                    line 26, change "connected" to --for connection--.
```

Signed and Sealed this

Third Day of June, 1997

Attest:

BRUCE LEHMAN

Attesting Officer        Commissioner of Patents and Trademarks